United States Patent [19]

Archer

[11] Patent Number: 5,761,050
[45] Date of Patent: Jun. 2, 1998

[54] DEFORMABLE PIN CONNECTOR FOR MULTIPLE PC BOARDS

[75] Inventor: Ian Archer, Strathaven, United Kingdom

[73] Assignee: CTS Corporation, Elkhart, Ind.

[21] Appl. No.: 702,348

[22] Filed: Aug. 23, 1996

[51] Int. Cl.⁶ .................. H01R 23/68; H01R 9/09
[52] U.S. Cl. .................. 361/791; 361/744; 361/790; 439/75
[58] Field of Search ............... 174/138 G; 361/735, 361/744, 790, 791; 439/45, 46, 75, 82, 870, 751, 943, 109; 29/838, 837, 845; 324/755, 756, 761, 765, 538; 411/500

[56] References Cited

U.S. PATENT DOCUMENTS

| 2,752,580 | 6/1956 | Shewmaker | 439/75 |
|---|---|---|---|
| 4,446,505 | 5/1984 | Long et al. | 361/791 |
| 4,728,164 | 3/1988 | Lemmens et al. | 439/870 |
| 4,828,514 | 5/1989 | Johnson et al. | 439/751 |
| 4,923,414 | 5/1990 | Sitzler | 439/751 |
| 5,106,310 | 4/1992 | Krajewski et al. | 439/75 |
| 5,230,642 | 7/1993 | Schempp | 439/751 |
| 5,259,111 | 11/1993 | Watanabe | 29/885 |
| 5,374,204 | 12/1994 | Foley et al. | 439/751 |
| 5,548,486 | 8/1996 | Kman et al. | 361/744 |

FOREIGN PATENT DOCUMENTS 3-263771  11/1991  Japan ........................ 439/82

OTHER PUBLICATIONS

IBM Technical Disclosure Bulletin "Force or Deflection Amplification Contact" by Byrnes vol. 8 No. 6 p. 838. Nov. 1985.

IBM Technical Disclosure Bulletin Two–Compliant–Section Pin Packaging vol. 37 No. 01 p. 597. Jan. 1994.

*Primary Examiner*—Donald Sparks
*Attorney, Agent, or Firm*—Michael W. Starkweather

[57] ABSTRACT

A press-fit or compliant section or deformable pin electrical connector. The connector is designed to be inserted into several plated through holes in printed circuit boards. Specifically, the pin connector can electrically and mechanically connect two or more printed circuit boards (PCBs). Uniquely, it is possible to have a single pin that is both electrically and mechanically connected to two PCBs and have the pin extending through a plated through hole of a third PCB without establishing any electrical or mechanical contact with the third PCB. Additionally, the pin has at least two compliant sections for press fitting into a plated through-hole in a PCB or the like. Each compliant section has a different size diameter. Specifically, the top compliant section is the smallest, the bottom compliant section is the largest in diameter, and the remaining compliant sections will gradually increase in size as they are located from the tip to the base of the pin.

6 Claims, 2 Drawing Sheets

DEFORMABLE PIN CONNECTOR FOR MULTIPLE PC BOARDS

BACKGROUND OF THE INVENTION

1. Field of the Invention

This invention relates to a press-fit or compliant section or deformable pin electrical connector. More particularly, it relates to connectors for insertion into plated through holes in printed circuit boards. Specifically, the invention relates to a pin connector that can electrically and mechanically connect two or more printed circuit boards (PCBs).

2. Description of the Related Art

Deformable pin connectors have existed for many years. They are used to shorten the assembly time and for allowing for later removal of connected items such as PCBs. When a pin is inserted into a metal plated hole the pin will deform in shape and wedge into the plated through-hole. Thus, an electrical contact is made and a secure hold is achieved. Prior methods typically required a pin tip to be inserted into and through a hole, where the pin would have to be soldered from the back side of the printed circuit board to create the electrical contact and to securely hold the pin in place.

Consumers have required smaller and smaller computer cases in recent years, from towers to mini-towers. As a result, PCBs and other circuit card physical arrangements have needed to become more compact. Thus, PCBs have needed to be placed very close together. The situation often occurs when a mother board needs to be connected to several equally large daughter boards. The typical connecting method is to connect the daughter boards perpendicular to the mother board. However, this perpendicular arrangement requires a large PCB profile requiring a larger computer case.

A parallel arrangement of the daughter cards to the mother boards is known to create a smaller profile. This arrangement works like a stack of playing cards. The difficult job is to try to both electrically and physically connect all of the cards together.

There are several known methods of connecting several parallel cards. See FIG. 1. One type of connector has pins designed with a deformable portion near the base of each pin and a longer pin section extending therefrom. Thus, it is possible to connect two PCBs by having the pin inserted into the first PCB and thereby deformably fitting thereto, and the extended pin portion is inserted through the second PCB through-hole and thereafter welded to create a secure electrical fit between the two PCBs.

One major drawback of this method is that it is expensive and time consuming to weld the end of each pin to the PCB. One connector could have as many as eighty or more closely positioned pins. The soldering of these pins requires extra time, welding equipment, and solder materials. Thus, a need exists for a method of connecting several PCBs without the need for soldering.

Examples of patents related to the present invention are as follows, and each patent is herein incorporated by reference for the supporting teachings: U.S. Pat. No. 5,374,204, is an electrical terminal with a compliant pin section. U.S. Pat. No. 5,259,111, is a method of producing terminal connector for a base board. U.S. Pat. No. 5,230,642, is a press-fit contact. U.S. Pat. No. 5,106,310, is a Z-axis pin connector for stacked printed circuit board assemblies. U.S. Pat. No. 4,923,414, is a compliant section for circuit board contact elements. U.S. Pat. No. 4,828,514, is an electrical connector with a compliant section. U.S. Pat. No. 4,728,164, is an electrical contact pin for printed circuit boards. U.S. Pat. No. 4,446,505, is an electrical connector for interconnecting printed circuit boards.

The foregoing patents reflect the state of the art of which the applicant is aware and are tendered with the view toward discharging applicant's acknowledged duty of candor in disclosing information that may be pertinent in the examination of this application. It is respectfully stipulated, however, that none of these patents teach or render obvious, singly or when considered in combination, applicant's claimed invention.

SUMMARY OF THE PREFERRED EMBODIMENT

It is a feature of the invention to provide a press-fit or compliant section or deformable pin electrical connector. More particularly, it relates to connectors for insertion into plated through holes in printed circuit boards. Specifically, the invention relates to a pin connector that can electrically and mechanically connect two or more printed circuit boards (PCBs). Uniquely, it is possible to have a single pin that is both electrically and mechanically connected to two PCBs and has the pin extending through a plated through hole of a third PCB without establishing any electrical or mechanical contact with the third PCB.

An additional feature of the invention is to provide a pin that has at least two compliant sections for press fitting into a plated through-hole in a PCB or the like. In particular, each compliant section has a different size diameter. Specifically, the top compliant section is the smallest, the bottom compliant section is the largest in diameter, and the remaining compliant sections will gradually increase in size as they are located from the tip to the base of the pin.

A further feature of the invention is to provide a strip of multi-compliant pins mounted upon a linear strip of material for easy removal of each pin form the strip.

The invention resides not in any one of these features per se, but rather in the particular combination of all of them herein disclosed and claimed and it is distinguished from the prior art in this combination of all of its structures for the functions specified.

There has thus been outlined, rather broadly, the more important features of the invention so the detailed description thereof that follows may be better understood, and so the present contribution to the art may be better appreciated. There are, of course, additional features of the invention that will be described hereinafter and which will form the subject matter of the claims appended hereto. Those skilled in the art will appreciate that the conception, upon which this disclosure is based, may readily be utilized as a basis for the designing of other structures, methods and systems for carrying out the several purposes of the present invention. It is important, therefore, that the claims are regarded as including such equivalent constructions insofar as they do not depart from the spirit and scope of the present invention.

Further, the purpose of the abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, neither is it intended to be limiting as to the scope of the invention in any way.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. The invention will be described with additional specificity and detail by the accompanying drawings.

DETAILED DESCRIPTION OF THE PREFERRED EMBODIMENT

Figure 2:
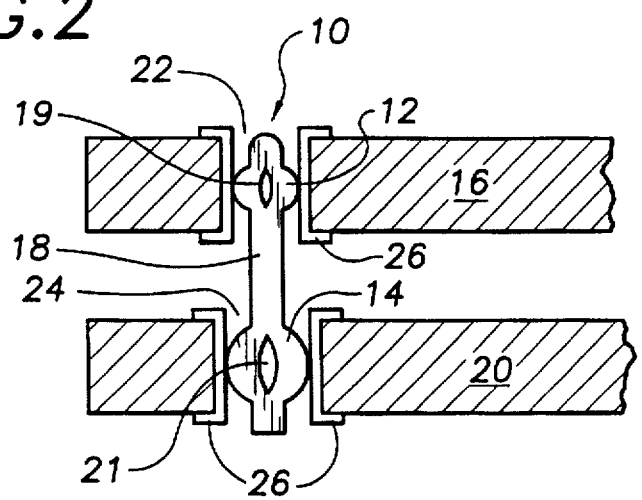
FIG. 2 is a cross sectional view of a first embodiment of the connector pin.
Figure 3:
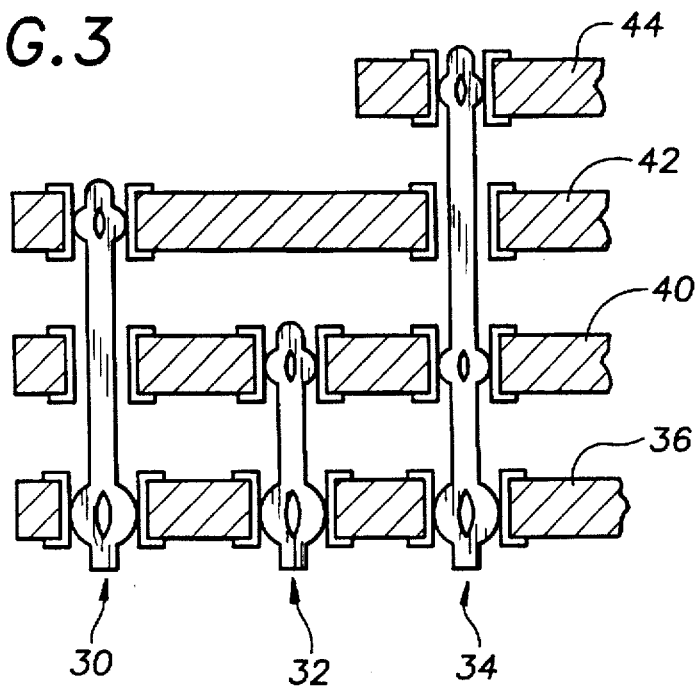
FIG. 3 is a cross sectional view of another embodiment of the connector pin.

The present invention provides a method for attaching several parallel oriented printed circuit boards (PCBs) together as shown in FIGS. 2 and 3. Referring to FIG. 2, there is a connector pin 10 that has a first and second deformable or compliant portion 12 and 14. The first compliant portion 12 is smaller than the second compliant portion 14. There is a neck 18 that connects the first and second compliant portions. Each compliant portion 12 and 14 has a hole 19 and 21 respectively located therein. There are two printed circuit boards (PCBs) 16 and 20 each having a through hole 22 and 24 plated with an electrical conductive material 26.

In operation, the first deformable portion 12 is inserted into and through a larger dimensioned through-hole 24 of one PCB 20 without deforming the plated material 26 or deforming the first compliant portion 12. As pin 10 continues to be inserted into the first circuit board 20, the neck portion 18 will extend into and through the larger through-hole 24 without any deformation to either the pin or plated material 26. The small compliant portion 12 will eventually reach the smaller dimensioned plated through hole 22. The compliant portions 12 and 14 are sized to be slightly larger than the respective plated through-holes 22 and 24 located in the respective PCBs 16 and 20. As pin 10 is inserted to its full extent both compliant portions 12 and 14 will begin to collapse the respective holes 19 and 21 as a result from contacting the smaller diameter plated through-holes 22 and 24. Upon reaching the full extent of insertion compliant sections 12 and 14 have been both physically deformably locked into the electrical conductive material 26 and electrically coupled to the plated through-holes.

second method and design for attaching several PCBs. In particular, there are three connector pins 30, 32, and 34 and four PCBs 36, 40, 42, and 44. The first pin 30 is mechanically and electrically coupled to the first 36 and third 42 PCBs, and the second pin 32 is mechanically and electrically coupled to the first 36 and second 40 PCBs. The third pin 34 is mechanically and electrically coupled to the first 36, second 40, and fourth 44 PCBs, and not to the third 42 PCB.

Figure 4:
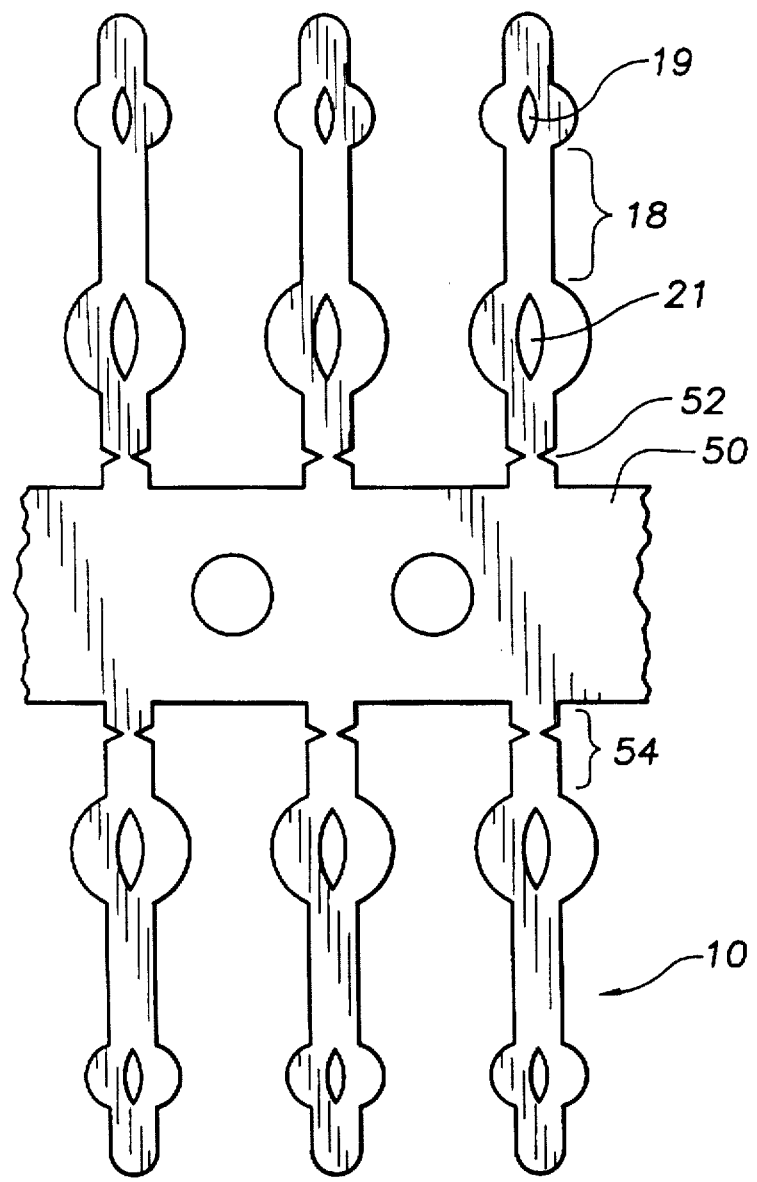
FIG. 4 is a top view of the connector pin from FIG. 2 attached to a strip containing several other connector pins.

In reference to FIG. 4, there is illustrated a set of pins 10 mounted upon a strip 50 having grooves 52 along the attachment portion 54 for providing quick easy breaking or removing of the pin 10 from the strip 50.

Remarks About the Preferred Embodiment

Figure 1:
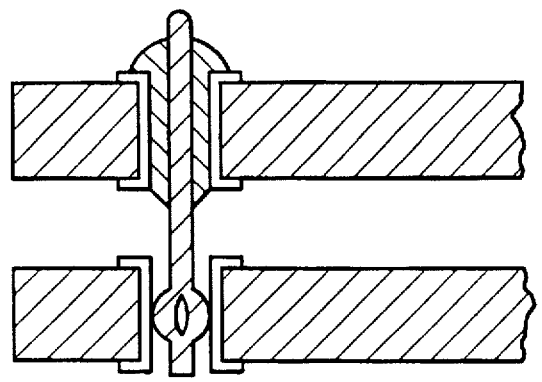
FIG. 1 is a cross sectional view of a related art embodiment.

One of ordinary skill in the art of press-fit pin connectors for printed circuit boards will realize many advantages from using the preferred embodiment. For example, there is an elimination of the prior welding process to attach the last PCB to the pin as illustrated in FIG. 1. The use of thin metal or conductive material in fabricating the pin and strip makes it easy to both remove the pins from the strip and press-fit the pins into PCB. The fact that the pins can be designed to interconnect several PCBs in different arrangements will allow for greater interconnectability. The fact that several PCBs can be located planer to each other allows for lower profiles or height needed to interconnect several PCBs.

Variations of the Preferred Embodiment

Although the illustrated embodiments discuss connecting the pins 10 to PCBs one skilled in the art will realize that the preferred embodiment would work to connect any circuity needing an interconnection pin, such as ceramic based circuits. Additionally, the preferred embodiment discusses the use of rounded compliant section 12 and 14, where in fact any shape would work, like oval or a three-dimensional shape. It is contemplated to design the holes 19 and 21 differently and still be within the scope of the invention. For example, it is equally likely that the compliant sections not have any hole therein, but would have a thinning of the material for example. In fact any arrangement that will provide for press-fit connection of the pin to a plated through-hole is contemplated.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed and desired to be secured by United States Patent is:

1. A combination connector pin and printed circuit board (PCB) assembly, comprising:
   a) a first, second, and third PCB each having a hole therein, the first PCB having the hole being smaller than the second and third PCB holes and the second PCB having the hole smaller than the third PCB hole, wherein the holes are designed to fit deformable connector pin heads to press therein;
   b) a multiple headed deformable connector pin, having:
      b1) a shaft having a first and second end;
      b2) a first and second head;
      b3) the first head having a smaller width than the second head;
      b4) the first head located near the first end; and
      b5) the second head located near the second end; and
   c) the first head is deformably held within the first hole, the second head is deformably held within the second hole, and the shaft extends through the third PCB without making electrical contact therewith.

2. The combination connector pin and printed circuit board (PCB) assembly of claim 1, wherein the first and second heads having portions therein defining a hole in each head.

3. The combination connector pin and printed circuit board (PCB) assembly of claim 2, wherein the third PCB is located between the first and second PCB.

4. The combination connector pin and printed circuit board (PCB) assembly of claim 3, wherein the all connector holes in the first PCB are a same size.

5. The combination connector pin and printed circuit board (PCB) assembly of claim 4, wherein all the connector holes in the second PCB are a same size.

6. The combination connector pin and printed circuit board (PCB) assembly of claim 5, wherein all the connector holes in the third PCB are a same size.

* * * * *